United States Patent
Kushnick

(10) Patent No.: US 7,996,168 B2
(45) Date of Patent: Aug. 9, 2011

(54) METHOD AND APPARATUS FOR TIME VERNIER CALIBRATION

(75) Inventor: Eric Barr Kushnick, Santa Clara, CA (US)

(73) Assignee: Advantest Corporation, Tokyo, Nerima-Ku (JP)

( * ) Notice: Subject to any disclaimer, the term of this patent is extended or adjusted under 35 U.S.C. 154(b) by 64 days.

(21) Appl. No.: 12/399,875

(22) Filed: Mar. 6, 2009

(65) Prior Publication Data

US 2010/0229053 A1 Sep. 9, 2010

(51) Int. Cl.
*G01R 13/00* (2006.01)
*G06F 11/00* (2006.01)

(52) U.S. Cl. ............. 702/69; 702/79; 702/117; 714/704

(58) Field of Classification Search .................. 702/69, 702/76, 79, 85, 89, 176, 117; 713/600; 368/113; 375/356; 377/20; 396/61; 714/704
See application file for complete search history.

(56) References Cited

U.S. PATENT DOCUMENTS

| | | | |
|---|---|---|---|
| 4,719,608 A | 1/1988 | Genat et al. | |
| 4,771,309 A * | 9/1988 | Ogihara et al. | 396/61 |
| 4,908,784 A | 3/1990 | Box et al. | |
| 5,214,680 A | 5/1993 | Gutierrez, Jr. et al. | |
| 6,609,077 B1 * | 8/2003 | Brown et al. | 702/117 |
| 2006/0265161 A1 * | 11/2006 | Querbach et al. | 702/79 |
| 2007/0033448 A1 * | 2/2007 | Waschura et al. | 714/704 |

FOREIGN PATENT DOCUMENTS

| | | |
|---|---|---|
| WO | WO-01/92904 A2 | 12/2001 |
| WO | WO-01/92904 A3 | 12/2001 |

OTHER PUBLICATIONS

International Search Report mailed Jul. 22, 2010, for PCT Application No. PCT/JP2010/001626, filed Mar. 8, 2010, six pages.
Written Opinion mailed Jul. 22, 2010, for PCT Application No. PCT/JP2010/001626, filed Mar. 8, 2010, four pages.

* cited by examiner

*Primary Examiner* — John H Le
(74) *Attorney, Agent, or Firm* — Morrison & Foerster LLP

(57) ABSTRACT

Disclosed is a method and apparatus for calibrating a time vernier in an automatic test equipment (ATE) system, the method including generating a data signal and a reference signal whose periods differ by a small amount (dt), using precession of the data signal and reference signal to create accurate delay increments, and creating a trigger signal for Bit Error Rate Test (BERT) counting, the trigger signal having a select frequency such than an integer number (N) of triggers are generated with a precession period ($T_{PRE}C$). Upon occurrence of each trigger, a BERT is initiated for measuring data to determine strobe positions with respect to the data signal.

22 Claims, 7 Drawing Sheets

METHOD AND APPARATUS FOR TIME VERNIER CALIBRATION

FIELD OF THE INVENTION

This relates generally to automatic test equipment (ATE) technologies, and more particularly, to a method and apparatus for calibrating a time vernier with an input data signal, a reference signal and a third trigger signal, all of which have pre-defined related frequencies so as to allow for accurate determination of vernier delays and strobe placement in an ATE system.

BACKGROUND OF THE INVENTION

In automatic test equipment (ATE) systems, a phase delay register is often used to control the placement of a clock signal or a strobe with respect to the input data signals. Sometimes the strobe signal is not available for direct measurement. The strobe position with respect to the input data waveform may be indirectly captured via placing strobes on a number of bits in a known input waveform and observing the number of errors produced, which gives a statistical indication when the strobe position coincides with the input bit transition time. In order to accurately determine the strobe positions, there is a need for time vernier calibration, or more precisely, a need for calibrating the actual delay of a strobe signal with respect to the programmed delay setting of a phase delay register.

Among the existing time vernier calibration methods, some require access to the input and output signals of the time vernier or time delay generator, or at least observability of periodic output signals from the time delay generator. For example, the time vernier can be placed in a feedback loop to make a ring oscillator so that the resulting signal frequency can be measured to determine the actual delay. Alternatively, the input and output signals from a timing generator can be observed by an oscilloscope or any other external time measurement instrument and the actual delay can be measured with the increase in the programmed time delay. However, these techniques are not applicable when the input and output signals of a time vernier or time delay generator are not accessible.

Time vernier calibration can also be accomplished through synchronizing an input signal with respect to the strobe signal and subsequently introducing known delays on the input signal. Under this approach, the strobe delay can be adjusted to find the edge transition of the delayed input signal and the known delay as compared to the programmed delay value. If the time verniers to be calibrated have pico-second step size, however, it is generally difficult and expensive to generate known delays with such sub-picosecond resolution and accuracy as necessary to calibrate the time verniers.

Another approach for time vernier calibration is to create accurate delay increments via "precession" or "walking" of two signals having closely spaced but not identical periods. The problem with this approach is the difficult alignment of two signals, namely, how to synchronize the two signals such that they can be consistently time aligned for repetitive measurements.

In light of the above, a need exists for an inexpensive and easy-to-implement method and apparatus for time vernier calibration that can greatly enhance existing ATE systems.

SUMMARY OF THE INVENTION

Embodiments of the present invention provide a method and apparatus for calibrating a time vernier with an input data signal, a reference signal and a third trigger signal, all of which have pre-defined related frequencies so as to allow for accurate determination of vernier delays and strobe placement in an ATE system. In one embodiment, a time vernier calibration method comprises generating a data signal and a reference signal whose periods differ by a small amount (dt); using precession of said data signal and reference signal to create accurate delay increments; and creating a trigger signal for BERT (Bit Error Rate Test) counting, said trigger signal having a select frequency such that an integer number (N) of triggers are generated within a precession period ($T_{PREC}$), wherein upon occurrence of each trigger, a BERT is initiated for data measurement in determining strobe positions with respect to said data signal In another embodiment, an apparatus comprises a data signal generator configured for generating a data signal; and a trigger signal generator configured for generating a trigger signal, wherein said data signal and a reference signal have close periods that differ by a small amount (dt) such that precession of said two signals creates accurate delay increments, and wherein said trigger signal has a select frequency such that an integer number (N) of triggers are generated within a precession period ($T_{PREC}$), and upon occurrence of each trigger, a BERT is initiated for data measurement in determining strobe positions with respect to said data signal.

Yet another embodiment provides a time vernier calibration method comprising generating two closely spaced signals including a data signal and a reference signal from a common reference frequency; receiving said data signal in a time vernier, said time vernier configured to introduce delays upon said data signal or said reference signal; setting a programmed delay in a phase delay register to a first value, said phase delay register configured to control strobe placement with respect to said data signal; and generating an integer number of triggers in a precession period with a desired resolution, each of said triggers initiating a BERT count for determining strobe positions with respect to said data signal. The time vernier calibration method can further comprise generating a reference frame based on said BERT counts at each of said triggers; and determining from said reference frame a first trigger number corresponding to a pre-defined error count rate, said first trigger number corresponding to said first value of said programmed delay. The time vernier calibration method can also comprise setting said programmed delay to a second value; generating said triggers with said desired resolution to initiate BERT counts; generating a representation based on said BERT counts at each of said triggers; determining from said representation a second trigger number corresponding to said pre-defined error count rate, said second trigger number corresponding to said second value of said programmed delay; and determining an actual time vernier delay based on said first trigger number, said second trigger number and said desired resolution. Or the method can comprise setting said programmed delay to a second value; using said reference frame to estimate one or more trigger numbers associated with said second value of said programmed delay; measuring data at triggers within a time interval around said estimated trigger numbers; determining from said measured data a second trigger number corresponding to said second value of said programmed delay; and determining an actual time vernier delay based on said first trigger number, said second trigger number and said desired resolution.

DETAILED DESCRIPTION OF THE PREFERRED EMBODIMENTS

In the following description of preferred embodiments, reference is made to the accompanying drawings which form a part hereof, and in which it is shown by way of illustration specific embodiments in which the invention can be practiced. It is to be understood that other embodiments can be used and structural changes can be made without departing from the scope of the embodiments of this invention.

Embodiments of the present invention relate to automatic test equipment (ATE) technologies, and more particularly, to a method and apparatus for calibrating a time vernier with an input data signal, a reference signal and a third trigger signal. The frequencies of all three signals are closely related and carefully chosen for accurate determination of vernier delays and strobe placement in an ATE system. In one embodiment, the data signal and reference signal are generated according to a system reference frequency such that their periods differ by a small amount. As a result, the precession of the two signals creates accurate delay increments. In addition, the trigger signal is created with a select frequency so that an integer number of triggers can be generated in one precession period, and upon occurrence of each trigger, a bit error rate test (BERT) count is initiated for measuring data to determine strobe positions with respect to said data signal.

Although embodiments of the invention may be described and illustrated herein using specific numbers, parameters, examples and flow diagrams to show the mathematical relationships between the input data signal, reference signal and trigger signal, the applicability of the present invention is not so limited. It should be understood that many variations can be implemented without departing from the spirit and scope of the present invention.

Figure 1:
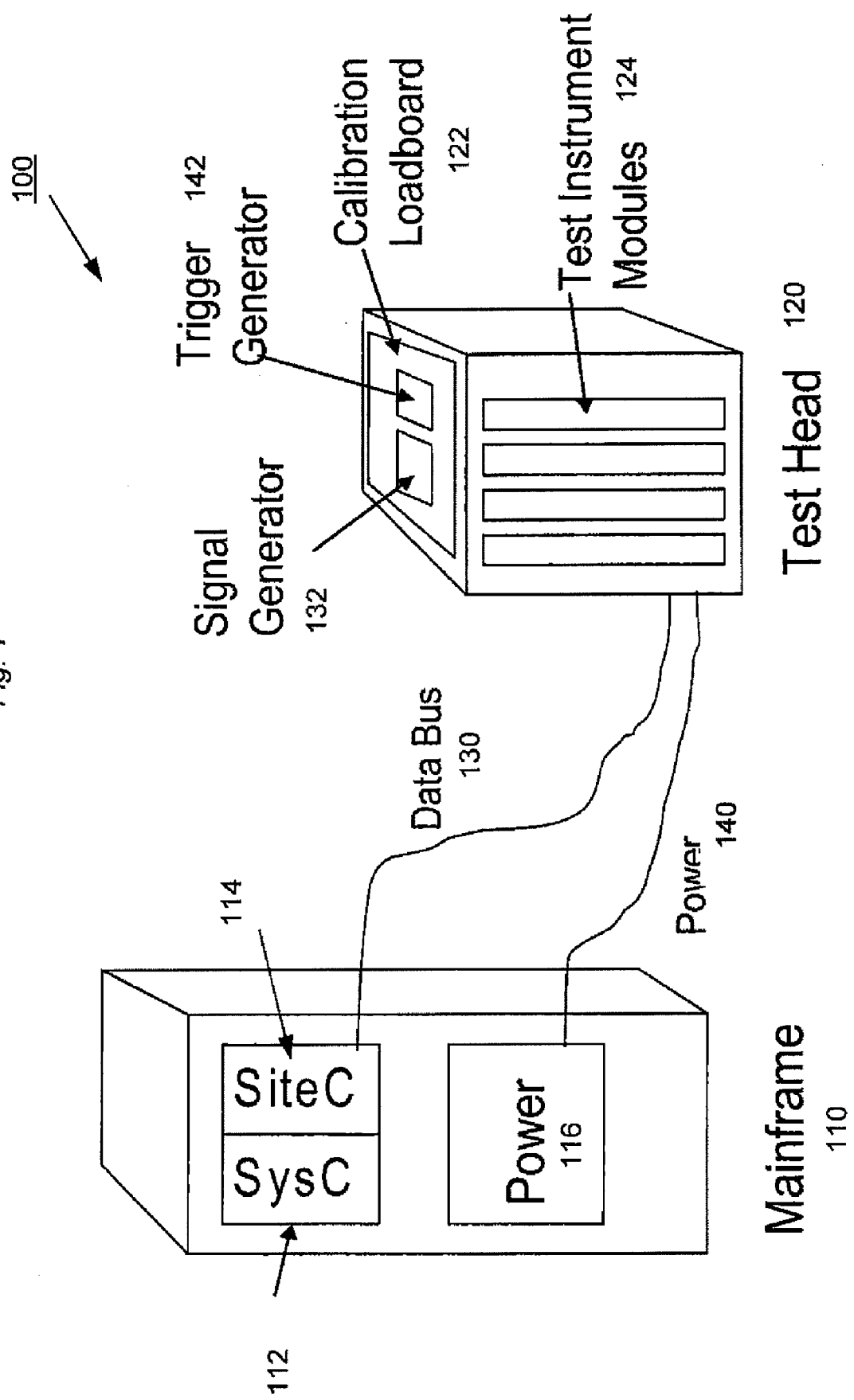
FIG. 1 is a high-level block diagram of an exemplary ATE system according to various embodiments of the present invention.

FIG. 1 provides a high-level overview of an exemplary ATE system 100 according to various embodiments of the present invention. As shown in FIG. 1, the ATE system 100 comprises a mainframe 110 coupled with a test head 120 via one or more data buses 130 and power connections 140. The mainframe 110 generally comprises one or more processors or network stations. Within each processor or CPU, there are various testing system software modules, such as a system controller 112 and a site controller 114, as well as hardware components, such as a power unit 116. Although not shown in FIG. 1, it should be understood that many other software, hardware and firmware components known in the art can reside in the mainframe 110.

The system controller 112, as the primary point of interaction for users, provides the gateway to the site controllers and synchronization of site controllers in a multi-site or multi-DUT (device under test) environment. In general, user applications, tools and a GUI (graphical user interface) would run on the system controller. In some circumstances, the system controller also acts as a repository for all test program related information, including test plans, compiled patterns, test parameters, files, and so forth.

The site controller 114 can control one or multiple test sites, where each test site is comprised of a collection of modules servicing the testing of a single DUT. In one embodiment, the site controller 114 also communicates with the system controller 112 through a communications library (not shown) that not only enables the user applications, tools and GUI to access the tester and test objects, but also allows the site-controller-based module software (e.g., software for the test modules 124) to access and retrieve pattern data therefrom. Usually an ATE system can comprise one or more site controllers and each site controller can control one or more test sites. For each test site under its control, a site controller provides high-level synchronization among the modules that are testing the corresponding DUT. For example, the site controller 114 in FIG. 1 can control and provide synchronization of the different test modules 124 in the test head 120 through the data bus 130.

The test head 120, at a high level, comprises one or more test instrument modules 124 and a calibration loadboard 122. As shown in FIG. 1, the calibration loadboard 122 comprises at least a signal generator 132 configured to generate an input data signal, and a trigger generator 142 configured to generate a trigger signal, which, as will be described in detail later, is introduced to facilitate timer vernier calibration according to various embodiments of the present invention. In some embodiments, the test instrument modules 124 in the test head 120 can be configured to perform the functions of the signal generator 132 and trigger generator 142. In other words, the signal and trigger generation functions can be integrated in the test instrument modules 124 according to various embodiments of the present invention.

A detailed view of the test head 120 is provided in FIG. 2, according to which exemplary interactions 200 between a calibration loadboard 222 and a test instrument module 224 will be described according to various embodiments of the present invention. As aforementioned, the calibration loadboard 222 includes a data signal generator 232 and a trigger generator 242 for generating an input data signal and a trigger signal, respectively. In addition to the two signals, a reference signal is generated by a data rate generator 234 in the test instrument module 224, which can be used to clock the data signal. As will be described in detail below with reference to FIG. 3, the input data signal generated by the data signal generator 232 and reference signal generated by the data rate generator 234 have very close but not identical periods so that accurate delay increments can be created from the "precession" of these two signals, i.e., the slow continuous change in time difference between a rising edge of the reference signal and the corresponding rising edge of the data signal. The trigger signal generated by the trigger generator 242 is used to trigger a single-shot BERT (Bit Error Rate Test) for the time vernier calibration. To that end, the trigger signal is set to have a period in accordance with the specific mathematical relationships between the data signal, reference signal and trigger signal, as will be described later. In one embodiment, the three signals are generated or derived from the same reference source, e.g., system reference frequency 210, so that the frequency ratio remains locked and the lower frequency noise and wander is coherent.

Figure 2:
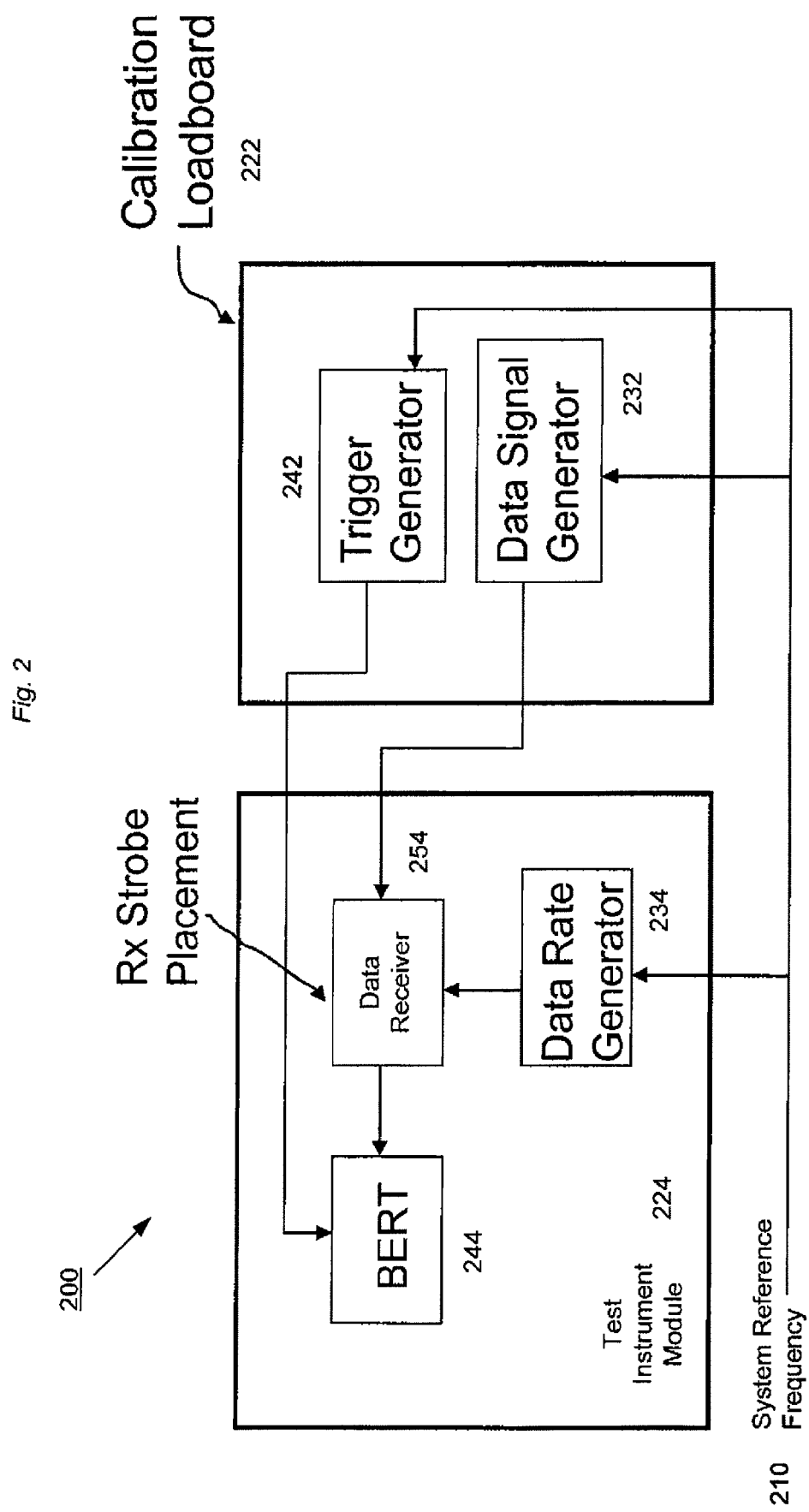
FIG. 2 is a detailed block diagram showing exemplary interactions between a calibration loadboard and a test instrument module in the system of FIG. 1 according to various embodiments of the present invention.

As seen in FIG. 2, the test instrument module 224 further comprises a BERT (Bit Error Rate Test) unit 244 and a data receiver 254 in addition to the above-mentioned data rate generator 234. As known in the art, BERT is a testing method for digital communication circuits using predetermined stress patterns that consist of a sequence of logical 1s and 0s generated by a pseudorandom binary sequence. Thus, a BERT unit typically includes a test pattern generator and a receiver configurable according to the same pattern. The BERT unit can be a stand-alone specialized instrument or incorporated in a computer to be integral with other instrument components. For example, in FIG. 2 the BERT unit 244 is coupled to the data receiver 254. In one embodiment, the trigger signal is received at the BERT unit 244 to trigger a BERT count, which can be used to determine the actual strobe position of a programmed Rx phase delay. The data receiver 254 typically controls Rx (receiving) strobe placement by setting phase delays to different known values. As shown in FIG. 2, the data receiver 254 receives the input data signal from the data signal generator 232 and the reference signal from the data rate generator 234. The output signal of the data receiver 254 (e.g., strobe signal) is received by the BERT unit 244 for data measuring and testing purposes.

Figure 3:
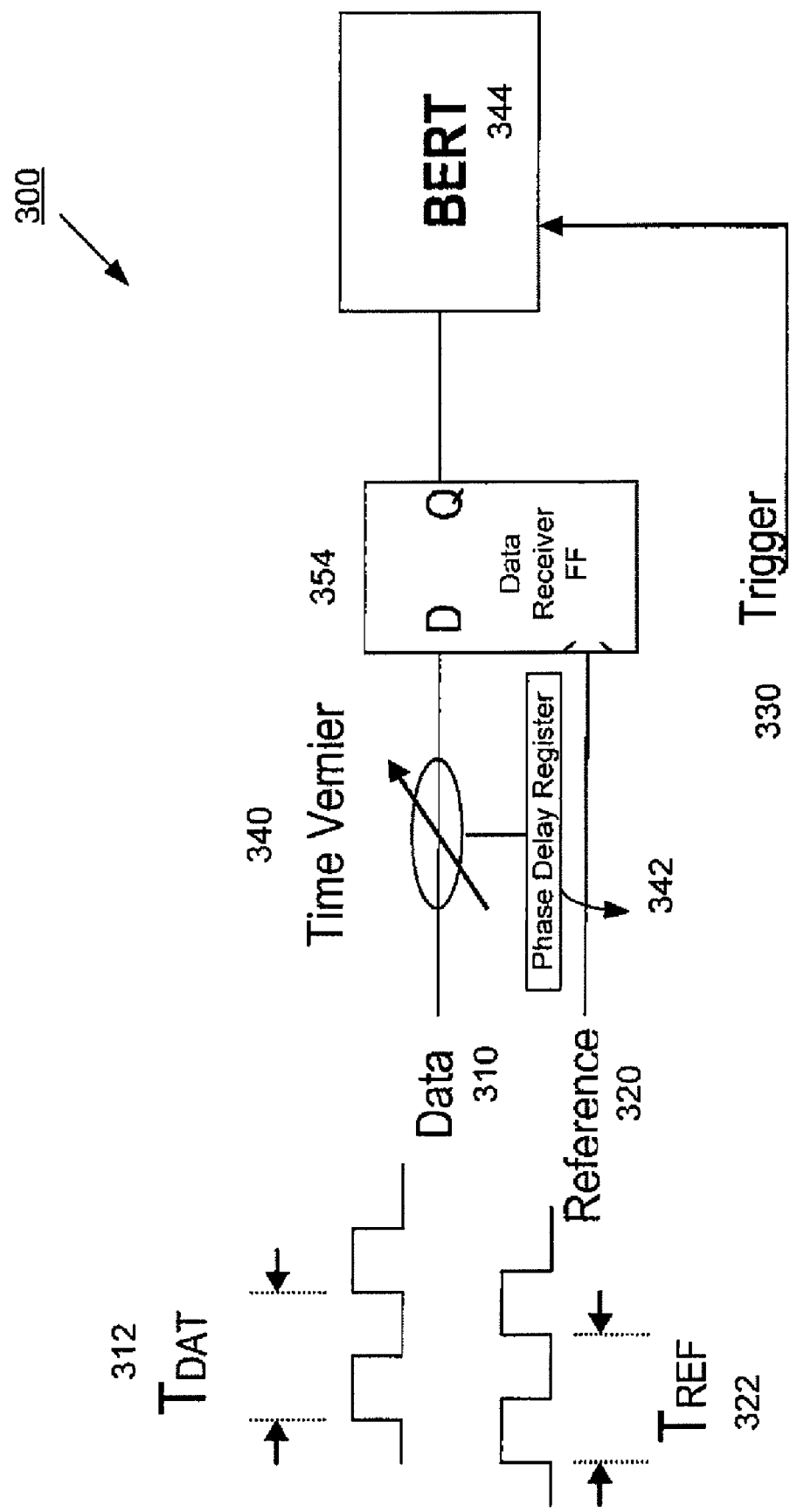
FIG. 3 is a simplified block diagram demonstrating an exemplary time vernier calibration method involving a trigger signal in addition to the data signal and reference signal according to various embodiments of the present invention.

Turning to FIG. 3, a simplified signal diagram 300 demonstrating a conjunctive use of data signal, reference signal and trigger signal in calibrating a time vernier is shown according to various embodiments of the present invention. As shown in FIG. 3, the data signal 310 and reference signal 320 are received at a data receiver flip-flop 354, and the trigger signal 330 is received at the BERT unit 344 to trigger BERT counting. The output signal from the data receiver flip-flop 354 is also received by the BERT unit 344 for testing purposes.

A time vernier 340 is employed to introduce time delays on the data signal 310 or the reference signal 320 before the delayed signals are received at the data receiver flip-flop 354. In FIG. 3, the time vernier 340 is shown to be positioned in the path of the data signal, but embodiments of the present invention are not so limited, and in some implementations, the timer vernier can also be positioned in the path of reference signal. In operation, the actual delays of a strobe signal will be calibrated with respect to the programmed delay settings of a Rx phase delay register 342 coupled to the timer vernier 340. Typically, a phase delay register is a digital register, i.e., a piece of hardware that holds a numerical value to be applied to the time vernier hardware in order to change an electrical signal path delay. For example, in slower speed technologies, a time vernier may be a string of gates, with the output of the first gate driving the input of the second gate, and so on. The outputs of each gate can also be sent to a mux, and the numerical value in the phase delay register is used as the select signal to the mux to determine which gate should send its output signal to the mux as the final output. It should be noted, however, this type of time vernier circuit may not be used for high speed signal testing with picosecond delays.

The data signal 310 has a data period 312 ($T_{DAT}$), which is the period or time interval between any two neighboring repeats of the fundamental pattern of the data signal. The data period $T_{DAT}$ is determined by the signal frequency. As an example, if the data signal is a 1010 . . . clock signal, then its data period can be calculated as: $T_{DAT}=2UI=2/(\text{Data Rate})$, where, as known in the art, UI (Unit Interval) represents one data period of a data signal, Data Rate represents a data speed measurement (e.g., data bytes per second), and their mathematical relationship is defined by UI=1/(Data Rate). Similarly, the reference signal 320 has a reference period 322 ($T_{REF}$), which is the period or time interval between any two successive rising (or falling) edges of the reference signal. The trigger signal also has a trigger period ($T_{TRIG}$), which is the time interval between successive BERT triggers. As will be described in detail below with reference to FIG. 5, the trigger period and associated trigger number (N) need to be carefully chosen in accordance with the specific mathematical relationships between data signal, reference signal and trigger signal for calibrating the time vernier.

Figure 4:
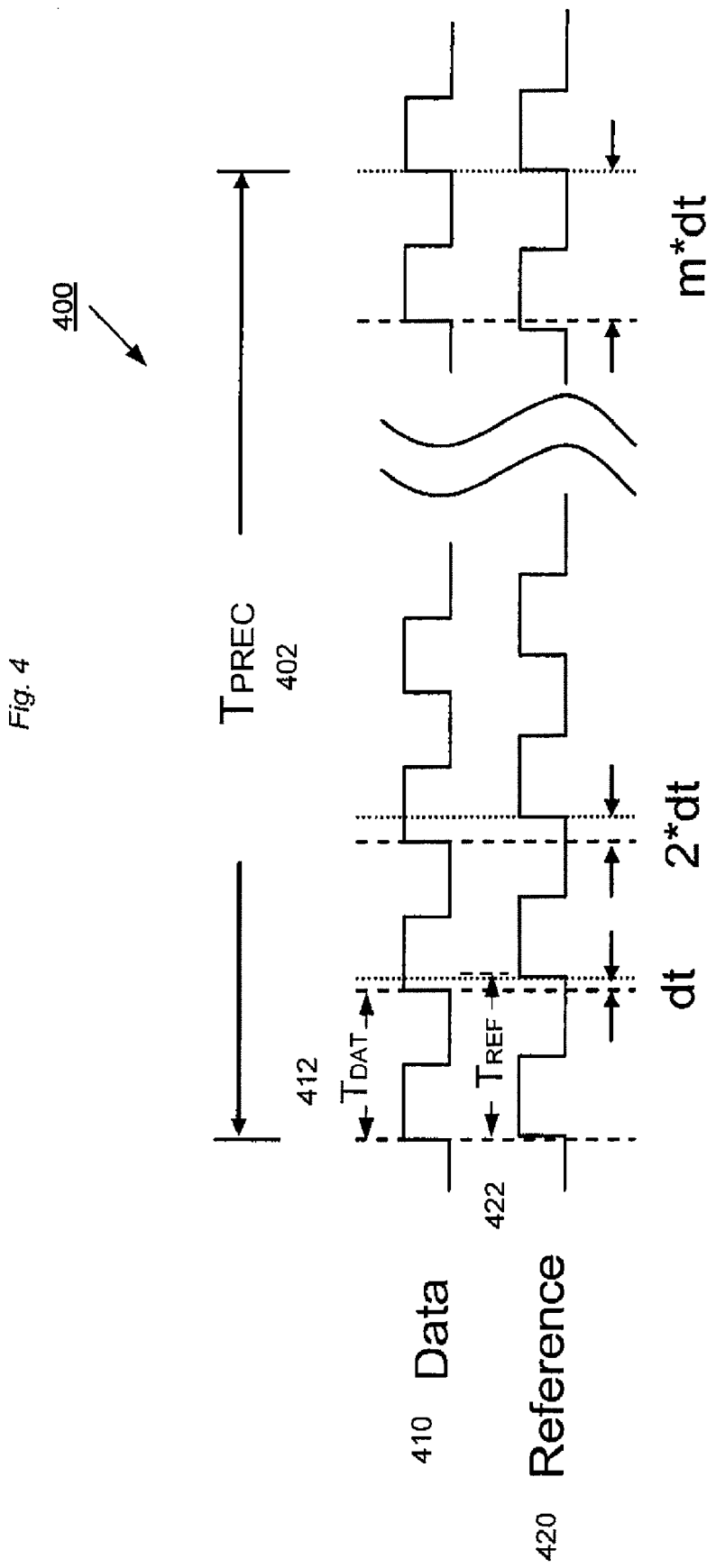
FIG. 4 is a timing diagram of exemplary data and reference waveforms having closely-spaced periods in a complete precession period according to various embodiments of the present invention.

In order to create accurate delay increments, the data period ($T_{DAT}$) and reference period ($T_{REF}$) are designed to differ by a small amount, as can be seen in FIG. 4, which provides a timing diagram 400 of exemplary data and reference waveforms of slightly different periods in one precession period according to various embodiments of the present invention. In FIG. 4, the data signal 410 has a data period 412 ($T_{DAT}$), while the reference signal 420 has a reference period 422 ($T_{REF}$), which differs from $T_{DAT}$ by a very small amount, i.e., dt. In other words, the relationship between the data period 412 and reference period 422 is defined by the following equation (1), where $dt<<T_{DAT}$:

$$T_{REF}=T_{DAT}+dt \quad (1)$$

As a result of such closely spaced periods, precession will occur between the data signal 410 and reference signal 420, with the lapse of time. After a complete precession period 402 ($T_{PREC}$), namely, the period or time interval starting at one edge alignment of the two signals and ending at the next edge alignment of the two signals, the rising edges of two signals will be aligned again, as shown in FIG. 4. It should be noted that the alignment in FIG. 4 is for illustration purposes only, and the timer vernier calibration method according to embodiments of the present invention is not dependent upon any particular edge alignment between the data signal and reference signal.

Assuming the re-alignment of the signals occurs at the time point when the reference signal has progressed m reference periods, where m is an integer >>1, then:

$$T_{PREC}=m \times T_{REF} \quad (2)$$

Further, based on the above equation (1), one precession period ($T_{PREC}$) can also be calculated in the following equation:

$$T_{PREC}=m \times (T_{DAT}+dt)=m \times T_{DAT}+m \times dt \quad (3)$$

Due to the small difference between $T_{DAT}$ and $T_{REF}$, at the time of re-alignment of two signals, the data signal has progressed m data periods plus m×dt, which would comprise one complete data period, namely, $$m \times dt = T_{DAT} \quad (4)$$

Or, $$m=T_{DAT}/dt \quad (5)$$

This means that within one complete precession period ($T_{PREC}$), the data signal has progressed (m+1) data periods. In other words, the relationship between a data period and a reference period is defined as follows:

$$T_{PREC}=m \times T_{REF}=(m+1) \times T_{DAT} \quad (6)$$

Because m is typically >>1, equation (4) can be converted to:

$$T_{PREC}=(m+1) \times T_{DAT} \approx m \times T_{DAT} \quad (7)$$

Further, m can be substituted by $T_{DAT}/dt$ according to equation (5), and thus $T_{PREC}$ can also be determined by:

$$T_{PREC} = T_{DAT} \times T_{DAT}/dt \quad (8)$$

The relationship between the data signal and reference signal can also be defined in terms of signal frequency. The two closely-spaced signals have a very small frequency offset (dF) according to one embodiment of the present invention. The frequency relationship between the data and reference signals is defined by the following equations:

$$F_{DAT} = 1/T_{DAT} \quad (9)$$

$$F_{REF} = 1/T_{REF} = F_{DAT} - dF \quad (10)$$

$$\begin{aligned} F_{REF} &= F_{DAT} - dF = 1/T_{REF} = 1/(T_{DAT} + dt) \quad (11)\\ &= (1/T_{DAT}) \times (1/(1+dt/T_{DAT}))\\ &\approx (1/T_{DAT}) \times (1 - dt/T_{DAT})\\ &= F_{DAT} - F_{DAT} \times dt/T_{DAT}\\ &= F_{DAT} - dt/(T_{DAT} \times T_{DAT}) \end{aligned}$$

Based on equations (7)-(9), the frequency offset (df) can be also determined by:

$$dF = dt/(T_{DAT} \times T_{DAT}) = 1/T_{PREC} \quad (12)$$

Thus, a complete precession period ($T_{PREC}$) will be:

$$T_{PREC} = 1/dF = (T_{DAT}/T_{DAT})/dF = T_{DAT} \times (F_{DAT}/dF) \quad (13)$$

Figure 5:
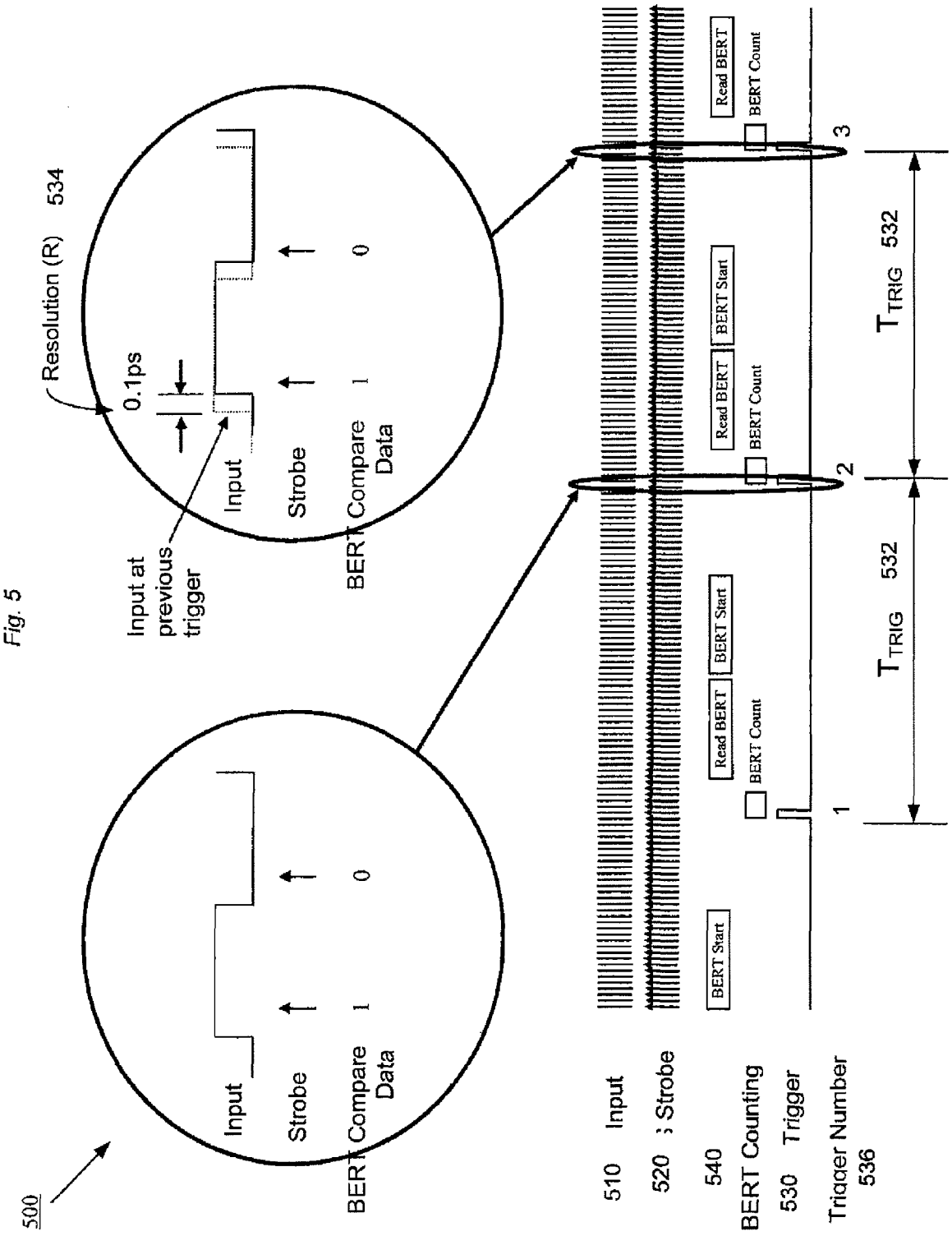
FIG. 5 is a timing diagram of an exemplary strobe placement with a desired resolution with respect to an input data signal according to various embodiments of the present invention.

FIG. 5 is a timing diagram 500 of an exemplary strobe placement with respect to input data signals with a desired resolution R according to various embodiments of the present invention. As shown in FIG. 5, strobes 520 are placed with respect to the input data signal 510 at positions controlled by a phase delay register. Upon each occurrence of a trigger 530 (e.g., Trigger 1, 2 and 3), a BERT count 540 is initiated to compare data with the input data signal 510. For purposes of illustration, FIG. 5 only shows three triggers, although it should be understood that any number of triggers can be chosen in terms of implementation of an ATE system. The trigger period ($T_{TRIG}$) 532 that represents the time interval between successive triggers needs to be set such that it is long enough to include the BERT count time and any hardware command interface time. In the meantime, the selected trigger period 532 needs to satisfy a desired resolution R 534, which is the amount of precession that occurs within one trigger period, to ensure the resolution is small enough to stay at, for example, the picosecond level (e.g., 0.1 ps in FIG. 5).

According to various embodiments of the invention, the trigger period ($T_{TRIG}$) 532 can be set such that an integer number of trigger periods, e.g., trigger number N 536 in FIG. 5, would occur in one complete precession period. This can be expressed in the following equation:

$$T_{PREC} = N \times T_{TRIG} \quad (14)$$

Based on equation (8) and equation (14), dt can be determined from the following equation:

$$dt = T_{DAT} \times T_{DAT}/(N \times T_{TRIG}) \quad (15)$$

In equation (13), N represents the number of trigger periods in one precession period. It can be determined by the following equation, where a desired resolution for measurement, R, is first selected:

$$N = int[T_{DAT}/R] \quad (16)$$

Alternatively, N can be selected such that $T_{DAT}/N$ approximately equals the desired resolution R. As an example, if N is set to be 4096, meaning that 4096 trigger periods occur during one precession period, then the data period $T_{DAT}$ will be 384.615 ps using a 1010 ... clock signal with 5.2 Gbps data rate, and the resolution R will be 0.0939 ps, meaning that approximately 0.1 ps of precession occurs per trigger period.

As seen in FIG. 5, during each BERT count 540, the input data signal 510 is still progressing with respect to the reference signal. This causes an error called drift error (DE), which represents the amount of precession that occurs during the BERT count period ($T_{BERT}$). The drift error can be determined by the following equation:

$$DE = T_{DAT} \times (T_{BERT}/T_{PREC}) \quad (17)$$

Using equations (12) and (14) for substitution, the drift error can also be:

$$DE = T_{DAT} \times (T_{BERT}/(N \times T_{TRIG})) \approx R \times T_{BERT}/T_{TRIG} \quad (18)$$

To ensure accuracy, drift error should be minimized or controlled within a certain range as compared to the resolution R. For example, if the requirement is DE<0.1×R, then, according to equation (18), the BERT duration $T_{BERT}$ should be less than 0.1 of the trigger period ($T_{TRIG}$).

Figure 6:
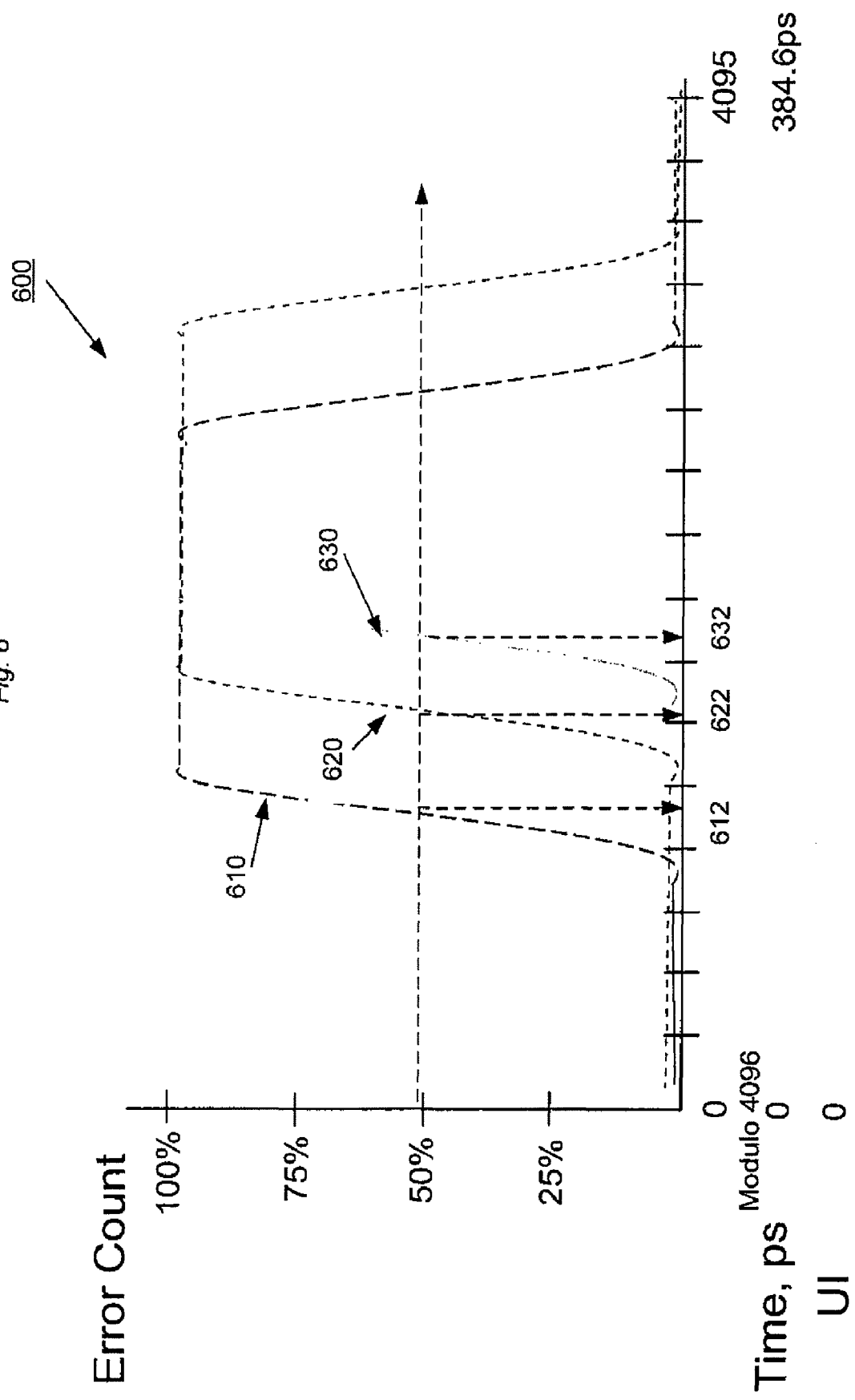
FIG. 6 is a coordinate diagram demonstrating exemplary graphs including a graphic reference frame resulting from plotting error counts versus trigger numbers according to various embodiments of the present invention.

FIG. 6 is a coordinate diagram 600 demonstrating exemplary graphs including a graphic reference frame resulting from plotting error counts versus trigger numbers according to various embodiments of the present invention. This diagram 600 demonstrates three curves including curve 610, curve 620 and curve 630, each demonstrating a relationship between the error count rate and corresponding trigger numbers (e.g., 0, 1, 2, ... 4095) under different Rx phase delay settings. Usually, on the average the trigger number corresponding to a 50% error count rate is considered to be the trigger number representative of the corresponding Rx phase delay setting. For example, in FIG. 6 the trigger number 612 represents a delay setting of 0 for curve 610, trigger number 622 represents a delay setting of 30 ps for curve 620, and trigger number 632 represents a delay setting of 51 ps for curve 630. In operation, a reference frame where the delay setting is typically set as 0 (e.g., graphic curve 610) can be established first to locate the trigger number representative of the delay setting (e.g., trigger number 612) with respect to all trigger numbers (e.g., 0, 1, 2, ... 4095) in a precession period. Then, by setting the phase delay to another value and running the BERT counts again, a trigger number corresponding to the new delay setting can be determined. Further, the actual time different between different delay settings can be obtained by multiplying the resolution with different trigger numbers representative of different delay settings. For instance, the actual time different between curve 620 and curve 610 will be R×(Trigger number 622−Trigger number 612). Following this process, the time differences between each delay setting and the initial reference setting (i.e., delay value=0) can be determined to find actual delays for each delay setting of the time vernier. By doing so, there is no need for any synchronization means or mechanisms for building a phase relationship between trigger numbers and the data or reference signals. This also eliminates a need to be aware of the phase of data signal versus reference signal, e.g., when the two signals will be aligned.

Specifically, the three example curves can be generated according to the assumptions and parameters set forth in the table below:

TABLE 1

|  | Curve 610 | Curve 620 | Curve 630 |
|---|---|---|---|
| Rx Phase Delay (ps) | 0 | 30 | 51 |
| Input data signal | 1010 ... clock signal | 1010 ... clock signal | 1010 ... clock signal |
| Data Rate (Gbps) | 5.2 | 5.2 | 5.2 |
| $T_{DAT}$ | 2UI = 2/(data rate) | 2UI = 2/(data rate) | 2UI = 2/(data rate) |
| $F_{DAT}$ (GHz) | 2.6 | 2.6 | 2.6 |
| N | 4096 | 4096 | 4096 |
| R (ps) | 0.094 | 0.094 | 0.094 |

It should be understood that the assumptions and parameters in the above table are for illustration only, and embodiments of the present invention are not so limited, but can be implemented with many variations including different values of N, frequencies, data rates, phase delays, and so forth.

Using curve 610 as an example, a process for establishing a graphic reference frame works as follows: first, setting the Rx phase delay in the time vernier to a known delay value, e.g., 0; then, using the trigger signal to generate N (e.g., 4096) triggers, and upon occurrence of each trigger (Trigger 0, 1, 2, ... 4095), initiating a BERT count. By plotting error counts versus the trigger number, a graphic curve, i.e., curve 610, can be generated, from which the trigger number corresponding to 50% error count rate can be identified. As shown in the diagram 600, the Y axis represents error count rate, and the X axis represents trigger numbers in the order from 0 to 4095, which also corresponds to time increments of approximately 0.1 ps (R=0.094 ps) per each trigger. It should be noted that the graph of BERT error count versus trigger number in any complete precession period is identical. Therefore, once an initial graph in one precession period, such as curve 610, is obtained, it becomes relatively easy to plot the graph of BERT error count versus trigger number in any other complete precession period, such as a fourth precession period comprising 4096 triggers from trigger number 12288 (=4096×3) to trigger number 16383 (=4096×4−1). As a result, with creation of an initial graph or a reference frame, other graphs showing subsequent strobe positions can be acquired by keeping track of the trigger numbers. Again, the advantage of the present invention is that no knowledge of the initial phase of the data signal to the reference signal is necessary for determining the trigger number or positions.

Curve 620 and curve 630 can be generated in a similar manner, and they correspond to two different Rx phase delay settings, i.e., 30 ps and 51 ps respectively, represented by two different trigger numbers, i.e., trigger number 622 and trigger number 632. As aforementioned, the time differences can be determined by a mere comparison of the new BERT error count plot graph with the reference frame, for example, curve 620 versus curve 610, or curve 630 versus curve 610. Therefore, embodiments of the present invention allow for determination of the strobe position or relative timing of each Rx phase delay setting by taking 4096 BERTs under each possible Rx phase delay setting, without stopping or resetting the input signal, reference signal or trigger signal. Once a reference frame is established to associate a trigger number with a phase delay setting (i.e., Rx phase delay=0), subsequent strobe positions or timing of different delay settings can be determined. In addition, based on the reference frame, trigger numbers corresponding to different delay settings can be estimated, which allows the data measurements to be performed at trigger numbers in a small interval surrounding the expected strobe position instead of each trigger number (e.g., from 0 to 4095, or 12288 to 16383 when N=4096). This can significantly reduce the measurement time. It should be understood that a reference frame and representations of different delay settings are not limited to the graphs shown in FIG. 6, but can be provided in various formats.

Figure 7:
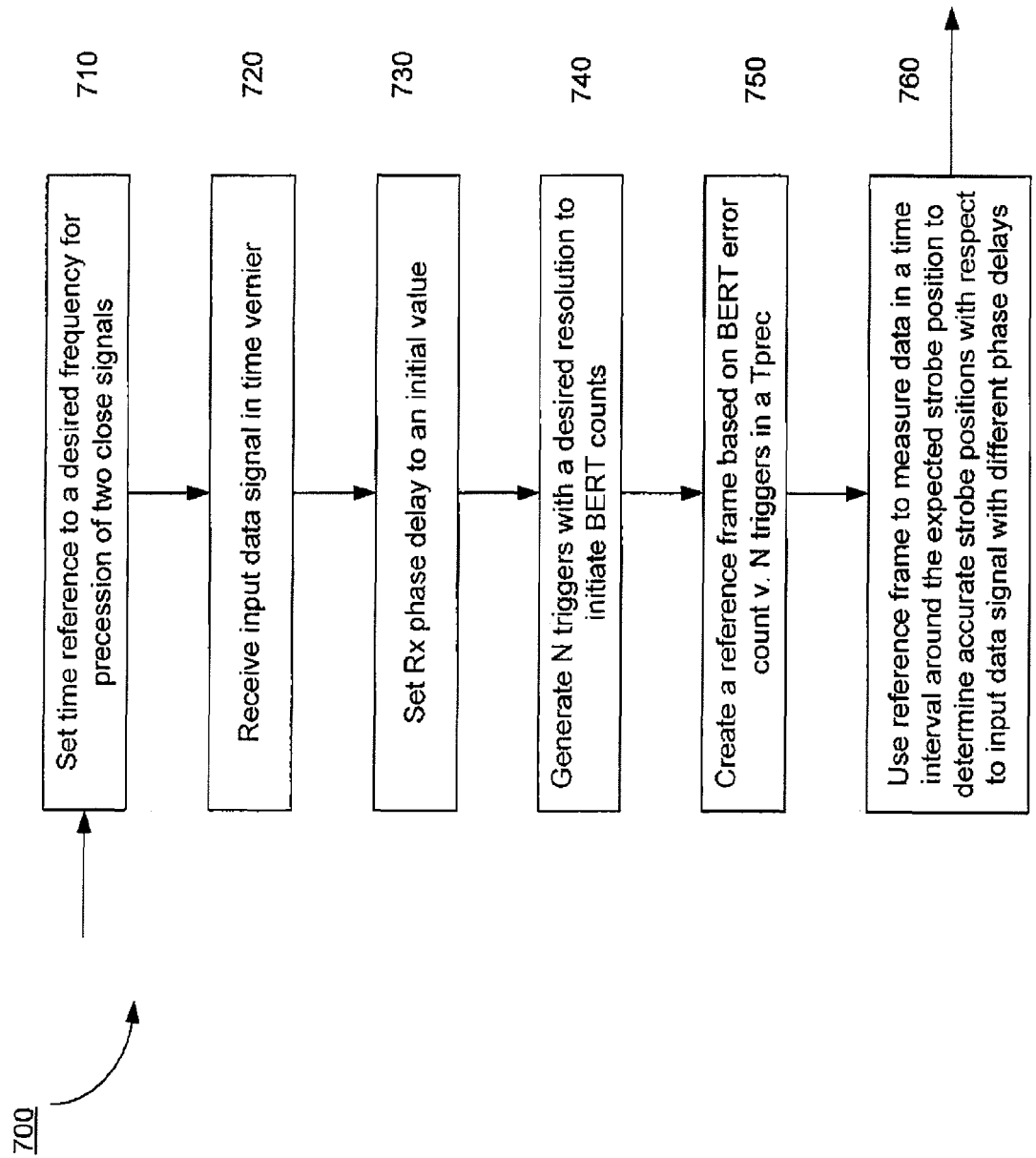
FIG. 7 is a flowchart diagram illustrating an exemplary time vernier calibration process using a third trigger signal according to various embodiments of the present invention.

FIG. 7 is a flowchart diagram 700 illustrating an exemplary time vernier calibration process using a third trigger signal according to various embodiments of the present invention. As seen in FIG. 7, the process starts at step 710 where the system time reference or data rate is set to a desired frequency so as to create precession of the input data signal and reference signal as described with reference to FIG. 4. At step 720, the input data signal, and more particularly, the timing edges of the input signal, would be received into a time vernier for calibration, as shown in FIG. 3. Subsequently, at step 730, time delay is introduced by setting the Rx phase delay to an initial value (0 for example) in the phase delay register. Then the process proceeds to step 740 in which an integer number of triggers, i.e., N triggers, are generated within a precession period, and upon occurrence of each trigger, a BERT is initiated for error counting. At step 750, a reference frame as described above can be created, which provides a graph resulting from plotting the error count versus the trigger number from 0 to N−1, for instance, and a trigger number corresponding to a phase delay of 0 can be identified. After such a reference frame is established, the trigger number corresponding to the Rx phase delay set to an initial value can be determined, which also gives indication of subsequent strobe positions or trigger numbers. As a result, data measurement can be greatly reduced for determining subsequent strobe positions with different Rx phase delay settings. As shown in step 760, data can be taken in a small interval around the expected strobe position to acquire the relative timing of different Rx phase delay settings.

In practice, the methods, processes or steps described herein may constitute one or more programs made up of machine-executable or computer-executable instructions. The above description, particularly with reference to the steps and flow charts in FIG. 7, enables one skilled in the art to develop such programs, including such instructions to carry out the operations represented by logical blocks on suitably-configured processors. The machine-executable instructions may be written in a computer programming language or may be embodied in firmware logic or in hardware circuitry. If written in a programming language conforming to a recognized standard, such instructions can be executed on a variety of hardware platforms for interfacing with a variety of operating systems. The present invention is not described with reference to any particular programming language, but it will be appreciated that a variety of programming languages may be used to implement the teachings of the invention as described herein. Furthermore, it is common in the art to speak of software, in one form or another (e.g., program, procedure, process, application, module, logic), as taking an action or causing a result. Such expressions are merely a shorthand way of saying that execution of the software by a machine causes the processor of the machine to perform an action or produce a result. It will be further appreciated that more or fewer processes may be incorporated into the methods illustrated in the flow diagrams without departing from the scope of the invention and that no particular order is implied by the arrangement of blocks shown and described herein.

Embodiments of the present invention may be described in the general context of processor-executable instructions. Processor-executable instructions may include programs, applications, coding, modules, objects, interfaces, components, data structures, frame organizations and/or preamble content, etc. that perform and/or enable the performance of particular tasks and/or implement particular data structures. Processor-executable instructions may be located in separate storage media, executed by different processors, and/or propagated over or extant on various transmission media. Moreover, processor-executable instructions may be embodied as software, firmware, hardware, fixed logic circuitry, some combination thereof, and so forth.

Although embodiments of this invention have been fully described with reference to the accompanying drawings, it is to be noted that various changes and modifications will become apparent to those skilled in the art. Such changes and modifications are to be understood as being included within the scope of embodiments of this invention as defined by the appended claims.

What is claimed is:

1. A method of for time vernier calibration in an automatic test equipment (ATE) system having a data signal generator and a trigger signal generator, said method comprising:
   generating a data signal by the date signal generator;
   generating a reference signal whose period differs from a period of the data signal by a small amount (dt);
   using precession of said data signal and reference signal to create accurate delay increments;
   creating a trigger signal by the trigger signal generator for BERT (Bit Error Rate Test) counting, said trigger signal having a select frequency such that an integer number (N) of triggers are generated within a precession period ($T_{PREC}$), wherein upon occurrence of each trigger, a BERT is initiated for measuring data to determine strobe positions with respect to said data signal;
   setting a delay setting of a phase delay register according to a programmed delay value;
   determining an actual delay of a strobe signal according to each of said strobe positions with respect to said data signal; and
   calibrating said actual delay with respect to said programmed delay value.

2. The method of claim 1, wherein said data signal has a data period ($T_{DAT}$), and said reference signal has a reference period ($T_{REF}$), said data period and said reference period having a relationship defined by $T_{REF}=T_{DAT}+dt$.

3. The method of claim 1, further comprising:
   creating a reference frame based on said BERTs, said reference frame indicating strobe positions with respect to said data signals within said precession period.

4. The method of claim 3, further comprising:
   based on said reference frame, generating an estimate of subsequent strobe positions with respect to said data signal in next one or more precession periods.

5. The method of claim 4, further comprising:
   changing said delay setting of said phase delay register according to a second programmed delay value so as to move strobe positions with respect to said data signal.

6. The method of claim 5, further comprising:
   measuring data at select triggers during a time interval surrounding estimated strobe positions to determine the strobe position with said changed delay setting having said second programmed delay value.

7. The method of claim 1, wherein there is a trigger period ($T_{TRIG}$) between successive BERTs, said trigger period defined by $T_{PREC}=N \times T_{TRIG}$.

8. The method of claim 1, wherein said data signal has a data frequency ($F_{DAT}$), and said reference signal has a reference frequency ($F_{REF}$), said data frequency and said reference frequency having a small frequency offset (df) defined by $F_{REF}=F_{DAT}+df$.

9. An apparatus comprising:
   a data signal generator configured for generating a data signal; and
   a trigger signal generator configured for generating a trigger signal, wherein said data signal and a reference signal have close periods that differ by a small amount (dt) such that precession of said two signals creates accurate delay increments,
   said trigger signal has a select frequency such that an integer number (N) of triggers are generated within a precession period ($Tp_{PREC}$), and upon occurrence of each trigger, a BERT is initiated for measuring data to determine strobe positions with respect to said data signal, and
   said data signal generator is further configured to communicate with a Rx phase delay register that controls placements of strobes with respect to said data signals.

10. The apparatus of claim 9, wherein said data signal has a data period ($T_{DAT}$), and said reference signal has a reference period ($T_{REF}$), said data period and said reference period having a relationship defined by $T_{REF}=T_{DAT}+dt$.

11. The apparatus of claim 9, wherein said Rx phase delay register is configured to control strobe placement by setting approximate delays.

12. The apparatus of claim 9, wherein said trigger generator is further configured to communicate with a BERT unit by sending said triggers to said BERT unit.

13. The apparatus of claim 9, further comprising a time vernier configured to introduce delays upon said data signals or said reference signals.

14. The apparatus of claim 9, wherein there is a trigger period ($T_{TRIG}$) between successive BERTs, said trigger period defined by $T_{PREC}=N \times T_{TRIG}$.

15. The apparatus of claim 9, wherein said data signal has a data frequency ($F_{DAT}$), and said reference signal has a reference frequency ($F_{REF}$), said data frequency and said reference frequency having a small frequency offset (df) defined by $F_{REF}=F_{DAT}+df$.

16. An automatic test equipment (ATE) system comprising said apparatus of claim 9.

17. The ATE system of claim 16, further comprising one or more test instrument modules controlled by a controller, said one or more test instrument modules configured to perform a data signal generation function or a trigger signal generation function.

18. A time vernier calibration method performed by an apparatus having a data signal generator and a trigger generator, the method comprising:
   generating two closely spaced signals including a data signal and a reference signal from a common reference frequency, the data signal generated by the data signal generator;
   receiving said data signal in a time vernier, said time vernier configured to introduce delays upon said data signal or said reference signal;
   setting a programmed delay in a phase delay register to a first value, said phase delay register configured to control strobe placement with respect to said data signal; and
   generating an integer number of triggers in a precession period with a desired resolution, each of said triggers initiating a BERT count for determining strobe positions with respect to said data signal, the triggers generated from a trigger signal which is generated by the trigger generator.

19. The time vernier calibration method of claim 18, further comprising:
    generating a reference frame based on said BERT counts at each of said triggers; and
    determining from said reference frame a first trigger number corresponding to a pre-defined error count rate, said first trigger number corresponding to said first value of said programmed delay.

20. The time vernier calibration method of claim 19, further comprising:
    setting said programmed delay to a second value.

21. The time vernier calibration method of claim 20, further comprising:
    generating said triggers with said desired resolution to initiate BERT counts;
    generating a representation based on said BERT counts at each of said triggers;
    determining from said representation a second trigger number corresponding to said pre-defined error count rate, said second trigger number corresponding to said second value of said programmed delay; and
    determining an actual time vernier delay based on said first trigger number, said second trigger number and said desired resolution.

22. The time vernier calibration method of claim 20, further comprising:
    using said reference frame to estimate one or more trigger numbers associated with said second value of said programmed delay;
    measuring data at triggers within a time interval around said estimated trigger numbers;
    determining from said measured data a second trigger number corresponding to said second value of said programmed delay; and
    determining an actual time vernier delay based on said first trigger number, said second trigger number and said desired resolution.

* * * * *